United States Patent [19]
Cox

[11] Patent Number: 5,401,968
[45] Date of Patent: Mar. 28, 1995

[54] BINARY OPTICAL MICROLENS DETECTOR ARRAY

[75] Inventor: J. Allen Cox, New Brighton, Minn.

[73] Assignee: Honeywell Inc., Minneapolis, Minn.

[21] Appl. No.: 458,878

[22] Filed: Dec. 29, 1989

[51] Int. Cl.6 .............................. G01J 1/00; G01J 5/08
[52] U.S. Cl. .................................. 250/353; 250/332; 250/349; 250/370.08
[58] Field of Search ............ 250/332, 349, 353, 370.08

[56] References Cited

U.S. PATENT DOCUMENTS

| | | | |
|---|---|---|---|
| 3,746,454 | 7/1973 | Pace et al. | 250/332 |
| 4,524,127 | 6/1985 | Kane | 350/167 |
| 4,575,631 | 3/1986 | Satchell | 250/332 |
| 4,588,261 | 5/1986 | Erhardt | 250/578 |
| 4,813,762 | 3/1989 | Leger et al. | 350/162.16 |
| 4,836,652 | 6/1989 | Oishi et al. | 350/334 |
| 4,846,552 | 7/1989 | Veldkamp et al. | 250/492.1 |

Primary Examiner—Stephen C. Buczinski
Attorney, Agent, or Firm—John G. Shudy, Jr.

[57] ABSTRACT

An uncooled IR array, in conjunction with an array of binary optical microlenses, having a large effective fill factor.

9 Claims, 4 Drawing Sheets

BINARY OPTICAL MICROLENS DETECTOR ARRAY

FIELD OF THE INVENTION

The present invention pertains to optical sensors and particularly to two dimensional detector arrays. More particularly, the invention pertains to optical microlens detector arrays having enhanced sensitivity.

BACKGROUND OF THE INVENTION

Two dimensional detector arrays have been used in optical sensors to convert a scene into an electronic image for processing and displaying. A disadvantage of related art sensor arrays is that each unit pixel cell of the sensors is significantly larger than the active detecting area of the cell. The reasons for the disparity are due to fabrication limitations and the need to incorporate electronic read-out components for each detection area.

SUMMARY OF THE INVENTION

The present invention is a binary optical microlens array integrated with a detector array having low fill factor, thereby resulting in an effective high fill factor for the combination. The fill factor of a detector array is the ratio of the active detector area to the total area of the pixel unit cell comprising the active detector area. A known way to increase the fill factor resulting in greater sensitivity or power from a detector array is to utilize a small optical lens, sometimes called an "immersion field lens," for refocusing the light or radiation of the sensed scene so as to concentrate all the light onto the active area of unit cell detector. However, to fabricate an array of conventional optical lenses to mate with such a detector array is difficult. Techniques have been developed in the art by using photoresist (PMMA) and laser heating on special materials. But these techniques are limited to certain materials and applicable only to a narrow range of spectral wavebands and detectors.

Application of binary optics technology to detectors and optics in uncooled thermal imagers results in increased range and performance and in reduced weight and cost of the imagers. An uncooled microbolometer detector array is integrated with an array of binary microlenses. The microlenses serve as field lenses to effectively increase the fill factor of the detector array.

BRIEF DESCRIPTION OF THE PREFERRED EMBODIMENT

Figure 1:
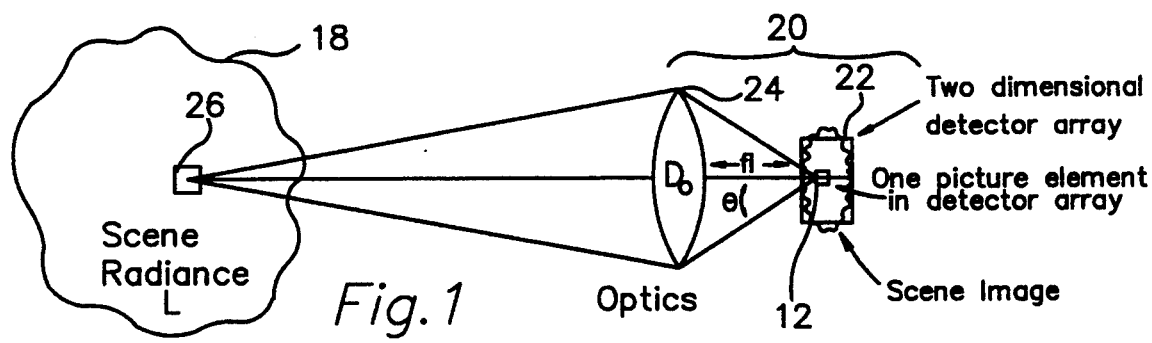
FIG. 1 reveals the basic optical scheme involving the invention.

FIG. 1 reveals a basic scheme having scene 18 with radiance L viewed by optical system 20 with an effective aperture 24 diameter $D_o$ and a focal length fl. Two dimensional detector array 22 is located at the image plane located at focal length fl of aperture 24. Within detector array 22 are picture elements 12 wherein each picture element 12 contains detector 14. A small portion 26 of scene 18 is on picture element 12 which is equivalent to a pixel of the image scene. The invention applies binary optic technology to fabricate a microlens array to mate with a two-dimensional detector array in order to attain a detector having an effective large fill factor, that is, $$FF = \frac{\text{Area of active detector}}{\text{Area of pixel unit cell}} = \frac{A_{det}}{A_{cell}}$$

Figure 2:
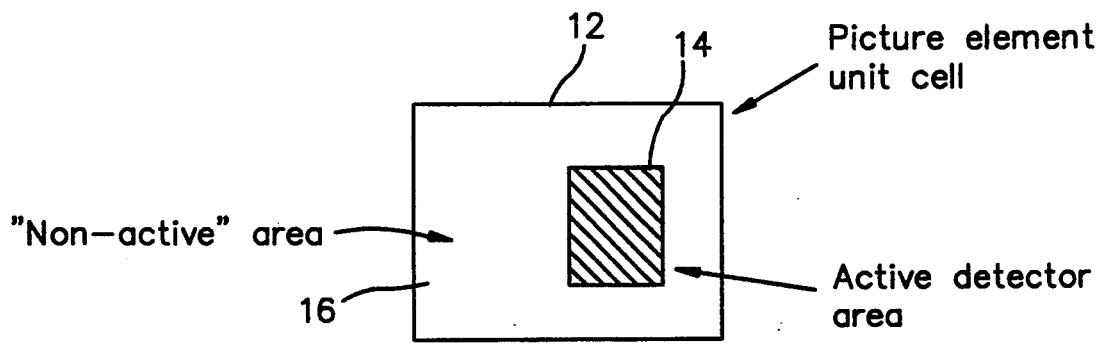
FIG. 2 shows a picture element sensor having active and inactive sensor areas.

FIG. 2 shows picture element or pixel unit cell 12 having an active detector area 14 and a non-active area 16. It is area 14 that light or radiation impinging pixel area 12 is preferably to be focused on.

Figure 3:
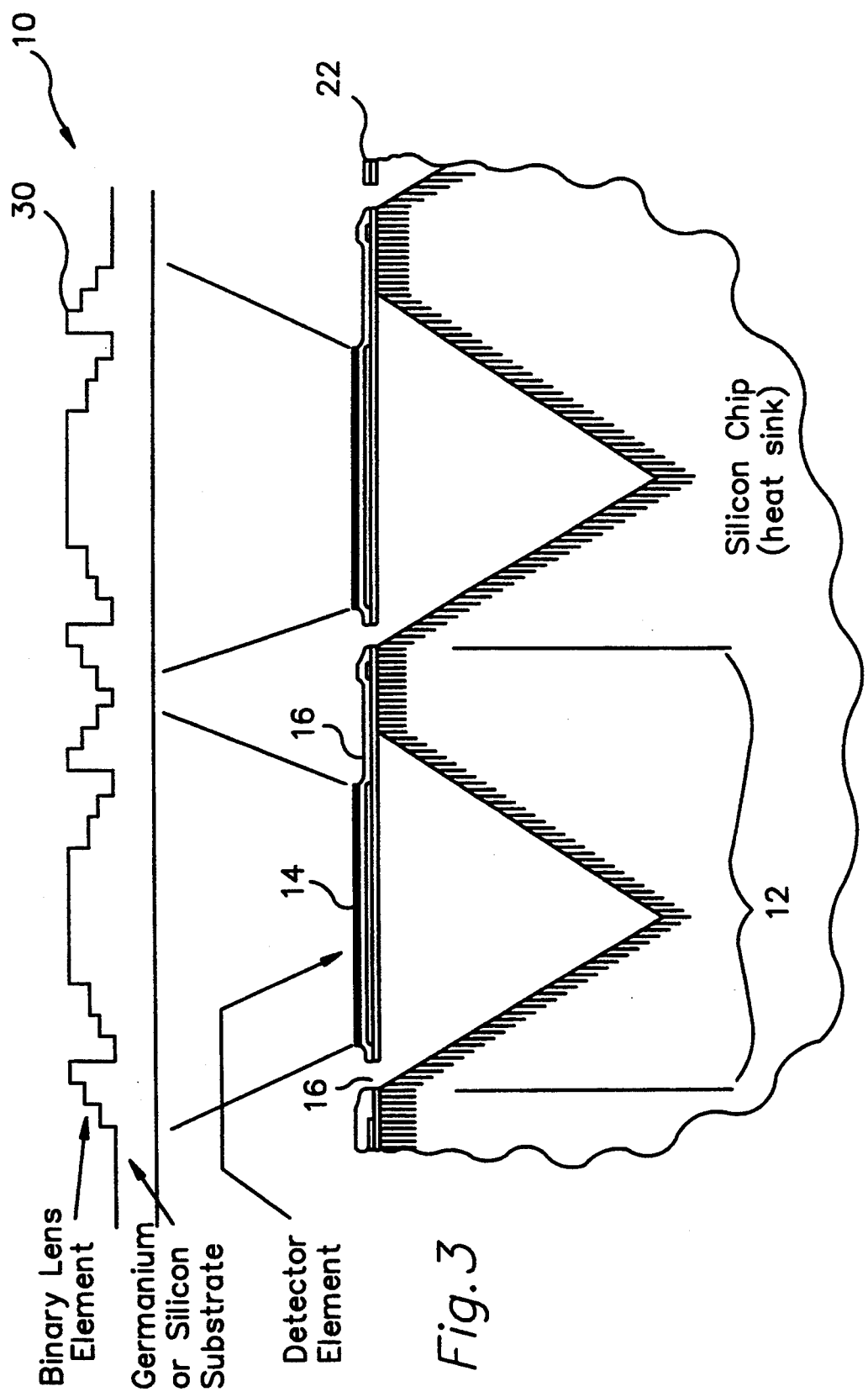
FIG. 3 is a cross-section of the uncooled detectors and associated microlenses.
Figure 4B:
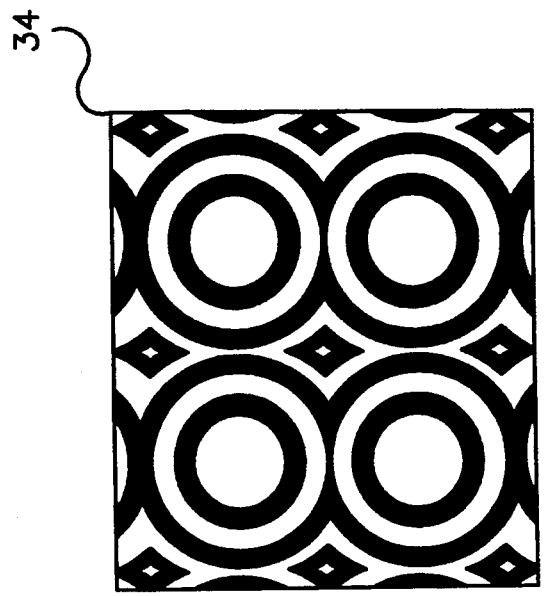
FIG. 4 shows four mask patterns for binary microlens elements.
Figure 4D:
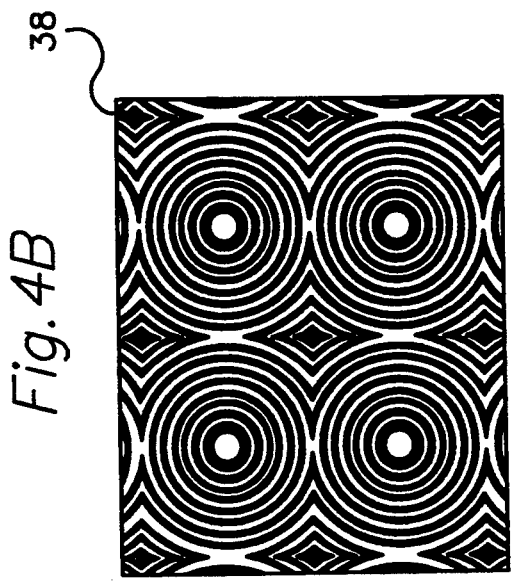
Figure 4A:
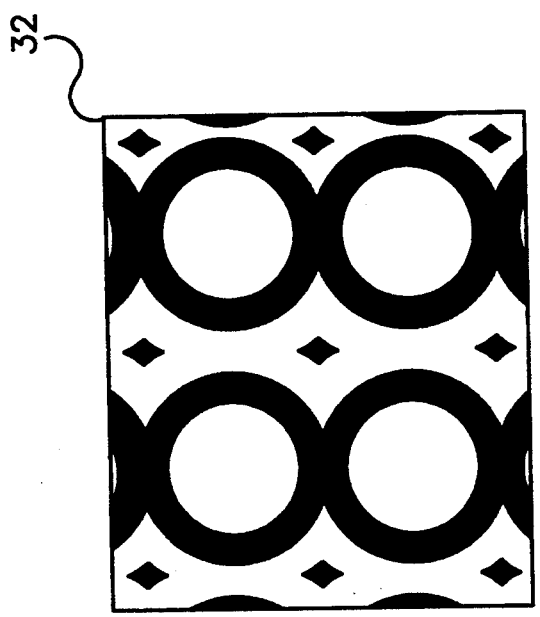
Figure 4C:
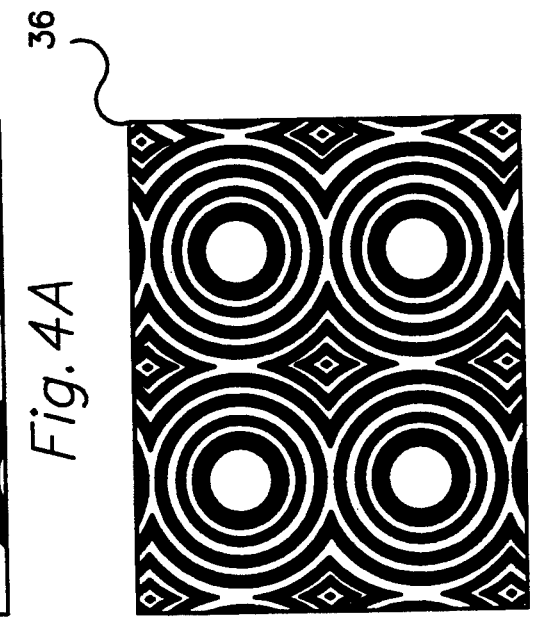

Each microlens is to function as an equivalent immersion field lens to concentrate the radiation or light onto underlying detector area 14. FIG. 3 shows a cross-section of invention 10 revealing one dimension of unit cell area 12 and active detector area 14. The differences between areas 12 and 14 comprise area 16. The invention causes the respective picture pixel that corresponds to area 12 to be concentrated onto area 14 for maximum power to and maximum sensitivity of sensor detector 10 of FIG. 3. The power and sensitivity of detector 14 depends on the strength of the electrical signal produced by detector 14. The concentration of the whole picture pixel onto detector 14 increases the electrical signal which is directly proportional to the radiation power ($P_{det}$) on active area 14 of detector 10. $P_{det}$ may be calculated by the following formula:

$$P_{det} = \tau_o \pi \frac{1}{4(f/)^2 + 1} FF \cdot A_{cell} \cdot L,$$

where $\tau_o$ is the transmittance of the optics, f/ is the focal ratio (fl/$D_o$) of the optical system, $\pi$ is 3.14159265359 . . . , (and as noted above) FF is the fill factor, $A_{cell}$ is the area of the pixel cell, and L is the radiance of the scene observed. The above-indicated formula shows that the radiation power on detector 10 and the resultant electrical signals depend directly on fill factor FF. Radiation that falls within pixel cell area 12, but not on detector active area 14, is wasted for purposes of signal generation.

The central purpose of the invention is to apply the technology of binary optics to fabricate microlens array or element 30 to mate with two-dimensional detector array 22 to achieve an effectively large fill factor FF. Each microlens functions as an equivalent field lens that concentrates the radiation of the picture or scene that typically would cover area 12, into the active detector area 14.

FIG. 3 shows a cross-section of array 22 along with microlens elements which may be fabricated utilizing integrated circuit techniques (i.e., photolithography, contact printing, dry etching and direct writing of marks) on various optical substrate materials (i.e., fused silica $SiO_2$, silicon, germanium, zinc sulfide and gallium arsenide). Microlens may be fabricated for use in a various spectral wavebands (i.e., visible, near infrared, far infrared, etc.) The specific binary microlens array 30 integrated with detector array 22 is infrared detector 10 operable in the 8 to 12 micrometer waveband. Microlens array 30 may be fabricated in a thin wafer of silicon, germanium, GaAs, ZnS, or other material that transmits in this spectral region and can be etched by reactive ion etching. Detector 10 has heat sink 44 to which the detectors of array 22 are attached. Heat sink 44 and the detectors of array 22 are monolithic. Heat sink 44 has pyramidal protrusions upon which the detectors are attached. Heat sink 44 is made of silicon.

Figure 5:
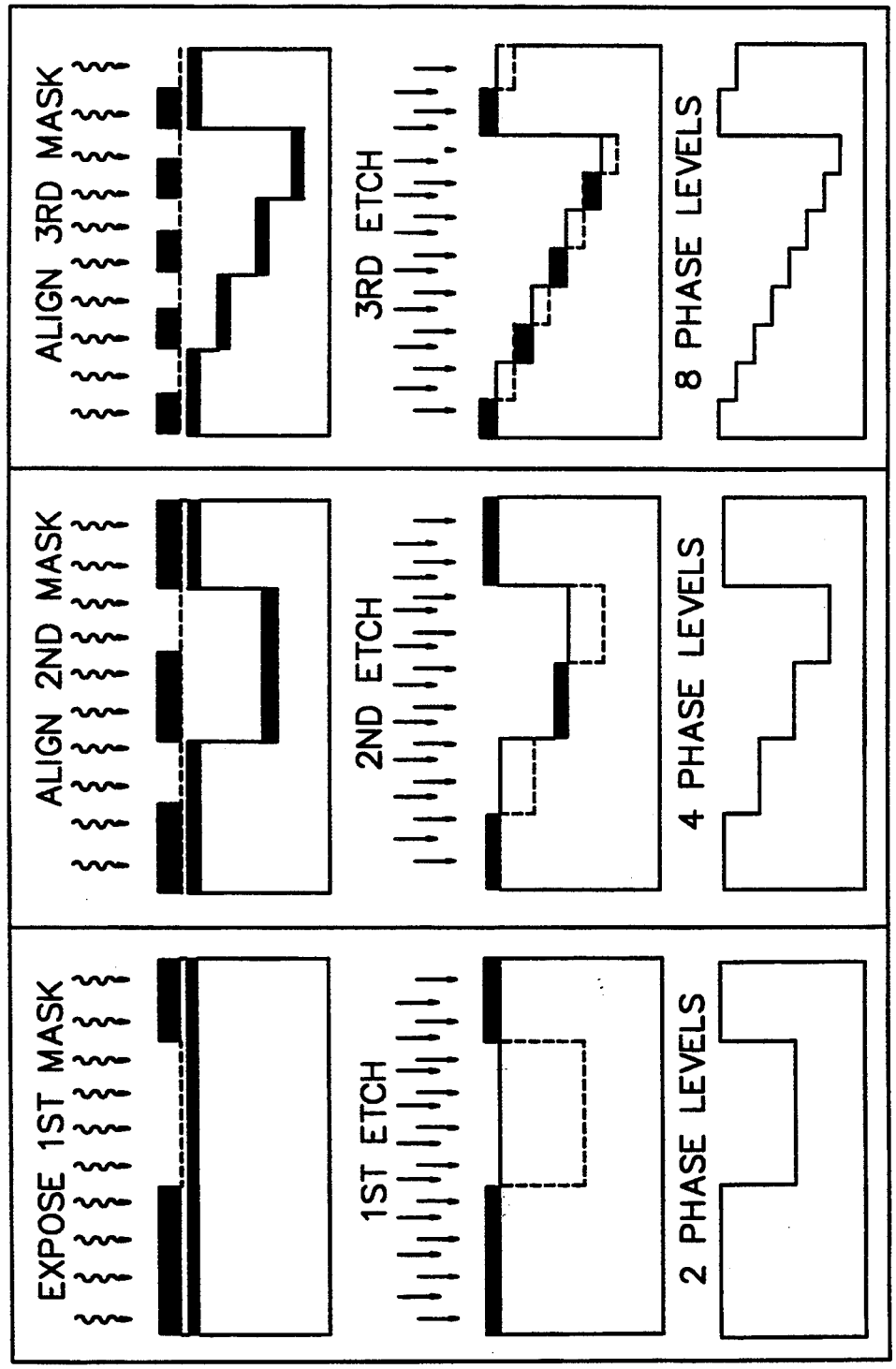
FIG. 5 indicates steps for binary microlens fabrication.

FIG. 4 illustrates four photolithographic mask patterns 32, 34, 36 and 38 for masks that are sequentially used to delineate the discrete steps of the binary microlens elements 30. Patterns 32, 34, 36 and 38 are primarily designed for uncooled detectors. The use of four masks having patterns 32, 34, 36 and 38, respectively, and etching sequences result in sixteen steps of gradation in each microlens, which can yield a diffraction efficiency greater than 98 percent. The use of only three masks having patterns 32, 34 and 36, respectively, results in eight steps of gradation for each microlens which yields a diffraction efficiency of 95 percent at the design wavelength of 10 micrometers. FIG. 5 shows the mask exposure and etch sequence for a three-masked lens structure.

A microlens array is mated with an uncooled IR detector. The detector elements having Honeywell Inc. ASP architecture. The optics in the current IR camera provides near-diffraction limited performance for a range of apertures from f/0.7 to f/3.7 over a semi-field angle of 3.7 degrees and over a spectral waveband of 8–12 micrometers. For the design of a binary microlens array, the IR fore-optics is taken to be f/2.2 with a 3.7 degree semi-field angle. The optimum microlens prescription is given in terms of phase function:

$$\phi(x,y) = \frac{2\pi}{\lambda} [C_3 X^2 + C_5 Y^2 + C_{10} X^4 + C_{12} X^2 Y^2 + C_{14} Y^4]$$

where $C_3 = -13.36$ millimeters (mm), $C_5 = -13.36$ mm, $C_{10} = 1884$ mm, $C_{12} = 3768$ mm and $C_{14} = 1884$ mm. The microlenses, under this formulation, are etched in a silicon substrate having an index of refraction equal to about 3.46. The f/ for each microlens is 0.9. When the microlens is used with a fore-optic having an f/ of 2.2, the f/ of the total system is 1.5.

Figure 6:
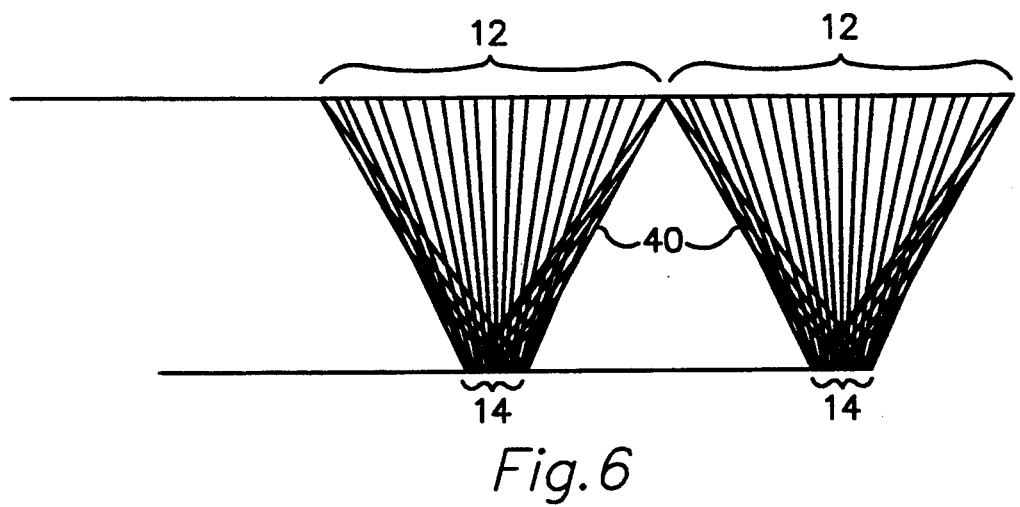
FIG. 6 shows how light is redirected by adjacent microlenses.

FIG. 6 is a plot that shows an optical retrace 40 of how two adjacent microlens elements refocus scene radiation L onto active detector area 14. For such refocus, the power increase to detector 14 is about four-fold greater than without the refocus.

Binary optics technology can be applied to both detector arrays and optics in uncooled thermal imagers to increase range and performance and to reduce weight and cost. Application of such technology involves integration of an uncooled microbolometer detector array with an array of binary microlenses that serve as field lenses to effectively increase the fill factor of the detector array. This approach offers several advantages. The microbolometer architecture inherently provides extraordinary thermal isolation of each element and consequently very good image detail and sensitivity. The penalty for good thermal isolation is a poor fill factor in that most of the radiant energy in each pixel is not converted to a useful signal. Use of the binary microlens array improves the effective fill factor and thus achieves a two-to-three-fold increase in sensitivity.

Two structural configurations of the microbolometer architecture were developed. The structure which is easier to fabricate has a much poorer fill factor than the other structure. Use of the binary microlens array permits use of a structure which is easier to fabricate without increased loss in sensitivity due to the poorer fill factor.

From a systems perspective, pixel dimensions of detector arrays are reduced to attain a smaller array for better packaging. However, as one reduces the dimensions of the array structure, the fill factor becomes worse. But the binary microlens array compensates for the worse fill factor of smaller detector array structures, thereby resulting in a smaller sensor retaining long range capability.

Another advantage provided by the invention is that, because an uncooled thermal system operates in the long wavelength infrared band, each microlens can be made optically fast (i.e., $\neq f/1$) without exceeding the limits of existing lithography. Putting optical "speed" into the microlens permits the use of slower fore-optics wherein the longer focal length permits longer range capability of the detector. Binary optics can be used in combination with conventional refractive elements to reduce the total number of elements, and weight and cost of the fore-optics, particularly, if the fore-optics are made slower than f/1.

I claim:

1. A binary optical microlens detector array for detecting radiation, comprising:
   an uncooled microbolometer detector array having a plurality of detectors, wherein each detector is contiguous to neighboring detectors in said uncooled microbolometer detector array, and each detector has an active area sensitive to radiation and an inactive area insensitive to radiation, and has a fill factor which is a ratio of the active area to the inactive area plus the active area; and
   a plurality of binary optical microlenses set in an array attached to said uncooled microbolometer detector array so that each microlens serves as a field lens for each detector of said plurality of detectors so as to effectively increase the fill factor of the uncooled microbolometer detector array to nearly 100 percent thereby increasing sensitivity and range of said uncooled microbolometer detector array, and wherein each microlens has a plurality of discrete steps of gradation.

2. Said binary optical microlens detector array of claim 1 wherein said uncooled microbolometer detector array comprises a heat sink to which the detectors are attached.

3. Said binary optical microlens detector array of claim 2 wherein:
   said plurality of microlenses is a monolithic array; and
   each microlens is a binary step-etched microlens.

4. Said binary optical microlens detector array of claim 3 wherein:
   said heat sink and detectors are monolithic; and
   said heat sink has pyramidal protrusions upon which the detectors are attached.

5. Said binary optical microlens detector array of claim 4 wherein said plurality of microlenses is a radiation-transmitting and reactive-ion-etched material.

6. Said binary optical microlens detector array of claim 5 wherein said heat sink is silicon.

7. Said binary optical microlens detector array of claim 5 wherein said plurality of microlenses is germanium.

8. Said binary optical microlens detector array of claim 5 wherein said plurality of microlenses is silicon.

9. Said binary optical microlens detector array of claim 5 wherein said binary optical microlens detector array is fabricated from material of a group consisting of GaAs, ZnS, Si and Ge.

* * * * *